(12) United States Patent
Gendai (10) Patent No.: US 8,521,794 B2
(45) Date of Patent: Aug. 27, 2013

(54) SIGNAL PROCESSING CIRCUIT, AGC CIRCUIT, AND RECORDING AND PLAYBACK DEVICE

(75) Inventor: Yuji Gendai, Kanagawa (JP)

(73) Assignee: Sony Corporation, Tokyo (JP)

( * ) Notice: Subject to any disclaimer, the term of this patent is extended or adjusted under 35 U.S.C. 154(b) by 607 days.

(21) Appl. No.: 12/823,180

(22) Filed: Jun. 25, 2010

(65) Prior Publication Data

US 2011/0001529 A1 Jan. 6, 2011

(30) Foreign Application Priority Data

Jul. 1, 2009 (JP) ................................ P2009-157254

(51) Int. Cl.
*G06F 17/10* (2006.01)
(52) U.S. Cl.
USPC .......................................................... 708/200
(58) Field of Classification Search
None
See application file for complete search history.

(56) References Cited

U.S. PATENT DOCUMENTS

| 3,141,982 | A  | * | 7/1964 | Smith  | 307/149 |
| 8,120,400 | B2 | * | 2/2012 | Gendai | 327/159 |
| 2011/0001524 | A1 | * | 1/2011 | Gendai | 327/156 |
| 2011/0001529 | A1 | * | 1/2011 | Gendai | 327/161 |

\* cited by examiner

*Primary Examiner* — David H Malzahn
(74) *Attorney, Agent, or Firm* — Frommer Lawrence & Haug LLP; William S. Frommer (57) ABSTRACT

Disclosed herein is a signal processing circuit including: a main path configured to transmit an input signal and output an actual signal; and a negative feedback path configured to feed back the actual signal to an input stage of the main path, wherein the main path includes a main path block that receives an input signal and outputs an actual signal, the negative feedback path includes a negative feedback block that generates a control signal and supplies the control signal to an input part of an input signal of the main path; a replica block that is supplied with a control signal of the negative feedback block to output a pseudo actual signal, and imitates the main path block; and a signal delay block that delays a pseudo actual signal of the replica block by a dead time of a loop.

10 Claims, 11 Drawing Sheets

| | | | | |
|---|---|---|---|---|
| A0 | 1.5 | | | |
| A1 | 2 | | L1 | 3 |
| A2 | 1 | | L2 | 15 |
| A3 | $\dfrac{1/32}{z-(1-1/32)}$ | | L3 | 10 |
| A4 | 1 | | L4 | 20 |
| INTEGRATOR | $\dfrac{K_i}{1-z^{-1}}$ | | | |

SIGNAL PROCESSING CIRCUIT, AGC CIRCUIT, AND RECORDING AND PLAYBACK DEVICE

BACKGROUND OF THE INVENTION

1. Field of the Invention

The present invention relates to a signal processing circuit, an AGC circuit, and a recording and playback device that can be applied to a loop circuit for automatic gain control (AGC), offset control, etc.

2. Description of the Related Art

Because of the transition of signal processing from analog implementation to digital implementation, complex processing that was difficult in the past is realized, and a problem of manufacturing variation can also be fundamentally resolved.

On the other hand, there is a trend that delay increases due to digital processing.

This increase does not present a serious problem when the signal flows in one direction. However, the system easily becomes unstable due to the increase in loop processing of AGC, phase locked loop (PLL), etc.

In the control theory, this delay is called "dead time" and distinguished from "delay time" occurring in a low-pass filter or the like.

The phenomenon that the feedback system becomes unstable due to the dead time is well known and is being studied from early times.

The origin of the studies is the method of Smith disclosed in U.S. Pat. No. 3,141,982 "CONTROL SYSTEM FOR USE IN CONTROL OF LOOPS WITH DEAD TIME" (hereinafter, Patent Document 1). Furthermore, a similar method is disclosed in Japanese Patent Laid-Open No. Sho 51-89083. In addition, another similar method is disclosed in Keiji Watanabe, "Mudajikan System no Seigyo" CORONA PUBLISHING CO., LTD. 1993 (hereinafter, Non-Patent Document 1).

Figure 1:
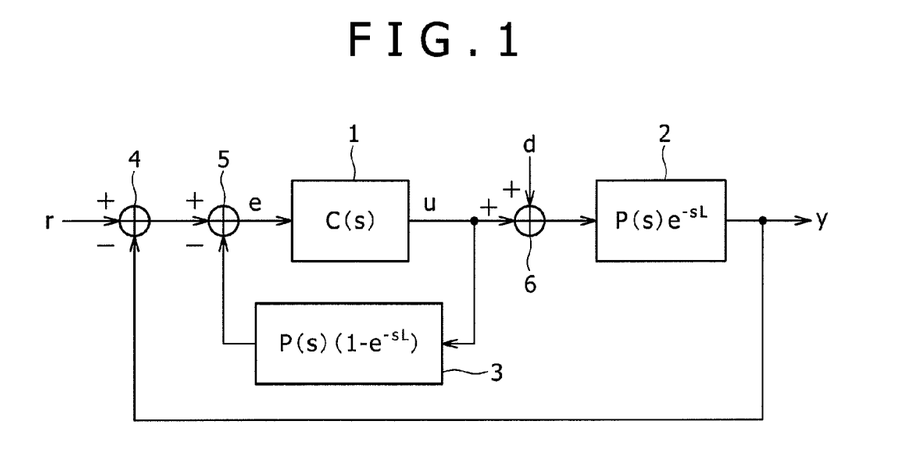
FIG. 1 is a diagram simplistically showing the method of Smith disclosed in Patent Document 1.

FIG. 1 is a diagram simplistically showing the method of Smith disclosed in Patent Document 1.

In FIG. 1, reference numeral 1 denotes a control signal generator, 2 denotes a control object, 3 denotes a dead time predictor, 4 to 6 each denote an adder (or subtractor).

In this method of Smith (hereinafter, the Smith method), the dead time predictor 3 is provided for the control signal generator 1 to thereby add correction in expectation of the delay corresponding to the dead time possibly involved by the control object 2.

In order for the Smith method to be effective, change in a reference signal r needs to be sufficiently slower than a dead time L.

In FIG. 1, reference symbol d denotes disturbance input to the adder 6. Fundamentally this disturbance is prepared in order to analyze the disturbance response characteristic of the system.

Figure 2:
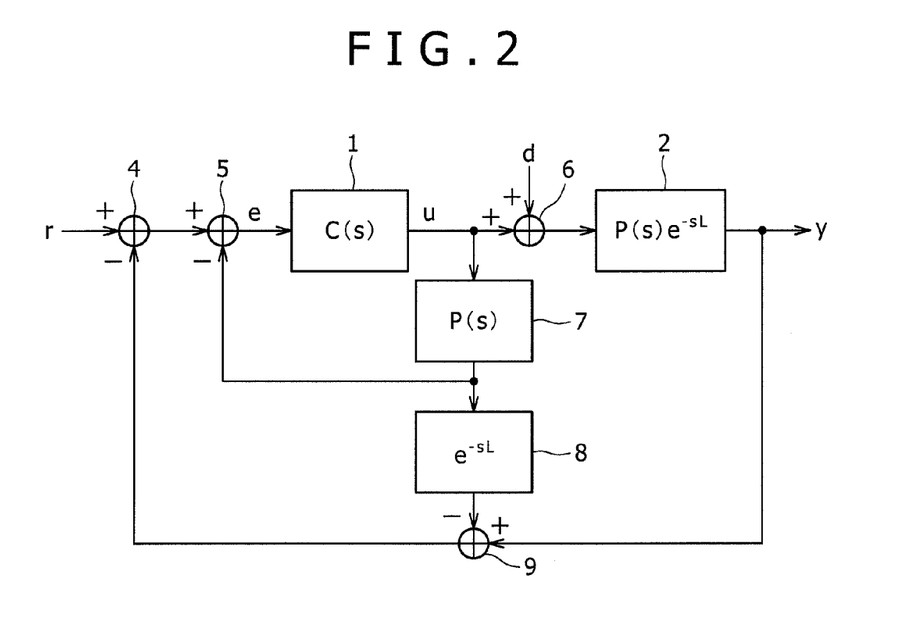
FIG. 2 is a diagram showing an example of a control system of the dead time disclosed in Non-Patent Document 1.

FIG. 2 is a diagram showing an example of the control system of the dead time disclosed in Non-Patent Document 1.

This implementation is basically the same as that of FIG. 1 in terms of the transfer function. However, it can be regarded as one in which an ideal closed-loop control system including no dead time is configured by combining a replica P(s) 7 arising from elimination of the dead time $e^{-sL}$ from the control object and the control signal generator C(s) 1.

Then this system can be interpreted as a system to "feed back to the input the difference between the actual response and the signal obtained by delaying the output of the ideal feedback system by the dead time" rather than a system to "correct the characteristics of the control signal generator."

The Smith method is formulated under the awareness of wanting an output signal y to follow the reference signal r with as high accuracy as possible. That is, it aims at y=r.

SUMMARY OF THE INVENTION

However, in the signal processing system, signal processing between the input and the output is intended, and the design of the transfer characteristic y/r is an issue.

Figure 3:
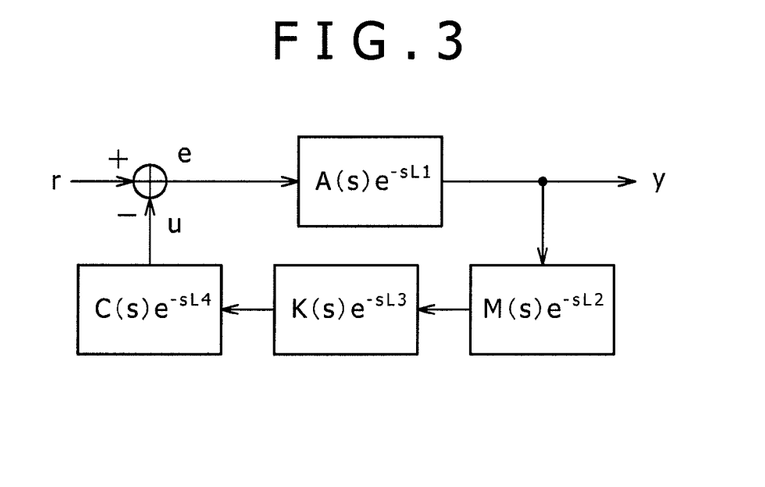
FIG. 3 is a diagram for explaining a dead time compensating system.

In terms of the block configuration, a dead time system like one shown in FIG. 3 needs to be considered.

In FIG. 3, A(s) denotes the transfer characteristic of the main path of the signal.

The feedback system is formed of transfer characteristics including no dead time, i.e. a measurement system M(s), a compensation system K(s), and a control signal generation system C(s), and the dead times of the respective blocks.

In this system, A(s), M(s), C(s), and the dead times of the respective blocks are given parameters to the system. Thus, the transfer characteristic y/r of the whole system is adjusted by K(s), which solely provides design freedom.

However, a sufficient response characteristic can not be achieved by solely K(s) if a dead time that is not ignorable exists with respect to the loop transfer function.

In the original Smith method, the control signal generator 1 is put before the A(s) system in the main path of the signal. Therefore, it is difficult to use it for the AGC etc. as it is.

There is a need for the present invention to provide a signal processing circuit, an AGC circuit, and a recording and playback device capable of compensating the influence of the dead time on the loop characteristics with high responsiveness.

According to a first embodiment of the present invention, there is provided a signal processing circuit including a main path configured to transmit an input signal and output an actual signal, and a negative feedback path configured to feed back the actual signal to an input stage of the main path. In the signal processing circuit, the main path includes a main path block that receives an input signal and outputs an actual signal. The negative feedback path includes a negative feedback block that generates a control signal and supplies the control signal to an input part of an input signal of the main path, a replica block that is supplied with a control signal of the negative feedback block to output a pseudo actual signal, and imitates the main path block, and a signal delay block that delays a pseudo actual signal of the replica block by a dead time of a loop. A first local negative feedback loop including a dead time is so formed as to include the negative feedback block, the replica block, and the signal delay block. A second local negative feedback loop including no dead time is formed by the negative feedback block and the replica block. The first local negative feedback loop inputs a synthesized signal arising from an output signal of the signal delay block and an actual signal to the negative feedback block.

According to a second embodiment of the present invention, there is provided an AGC circuit including a main path configured to adjust the amplitude of an input signal and output an actual signal, and a negative feedback path configured to feed back amplitude information of the actual signal to an amplitude adjustment stage in the main path. In the AGC circuit, the main path includes a variable gain unit that varies the amplitude of an input signal depending on a control signal. The negative feedback path includes an amplitude detector that detects the amplitude of an actual signal output from the main path, and a control block that generates the control signal from amplitude information by the amplitude detector and target amplitude and outputs the control signal to the variable gain unit. The control block includes a negative feedback block that generates a control signal and supplies the control signal to an input part of an input signal of the main path, a replica block that is supplied with a control signal of the negative feedback block to output a pseudo amplitude signal, and imitates the main path block, and a signal delay block that delays a pseudo amplitude signal of the replica block by a dead time of a loop. A first local negative feedback loop including a dead time is so formed as to include the negative feedback block, the replica block, and the signal delay block. A second local negative feedback loop including no dead time is formed by the negative feedback block and the replica block. The first local negative feedback loop inputs a synthesized signal arising from an output signal of the signal delay block and an amplitude signal of an actual signal to the negative feedback block.

According to a third embodiment of the present invention, there is provided a recording and playback device including a pickup element configured to pick up information of a recording medium, and an AGC circuit configured to adjust a signal level picked up by the pickup element. In the recording and playback device, the AGC circuit includes a main path that adjusts the amplitude of an input signal and outputs an actual signal, and a negative feedback path that feeds back amplitude information of the actual signal to an amplitude adjustment stage in the main path. The main path includes a variable gain unit that varies the amplitude of an input signal depending on a control signal. The negative feedback path includes an amplitude detector that detects the amplitude of an actual signal output from the main path, and a control block that generates the control signal from amplitude information by the amplitude detector and target amplitude and outputs the control signal to the variable gain unit. The control block includes a negative feedback block that generates a control signal and supplies the control signal to an input part of an input signal of the main path, a replica block that is supplied with a control signal of the negative feedback block to output a pseudo amplitude signal, and imitates the main path block, and a signal delay block that delays a pseudo amplitude signal of the replica block by a dead time of a loop. A first local negative feedback loop including a dead time is so formed as to include the negative feedback block, the replica block, and the signal delay block. A second local negative feedback loop including no dead time is formed by the negative feedback block and the replica block. The first local negative feedback loop inputs a synthesized signal arising from an output signal of the signal delay block and an amplitude signal of an actual signal to the negative feedback block.

According to the embodiments of the present invention, the influence of the dead time on the loop characteristics can be compensated with high responsiveness.

DETAILED DESCRIPTION OF THE PREFERRED EMBODIMENTS

Embodiments of the present invention will be described below in association with the drawings.

The description will be made in the following order.
1. First Embodiment (Basic Configuration of Signal Processing Circuit)
2. Second Embodiment (Preferred Configuration of Signal Processing Circuit)
3. Third Embodiment (Configuration Example of AGC Circuit)
4. Fourth Embodiment (Configuration Example of Recording and Playback Device)

1. First Embodiment

Figure 4:
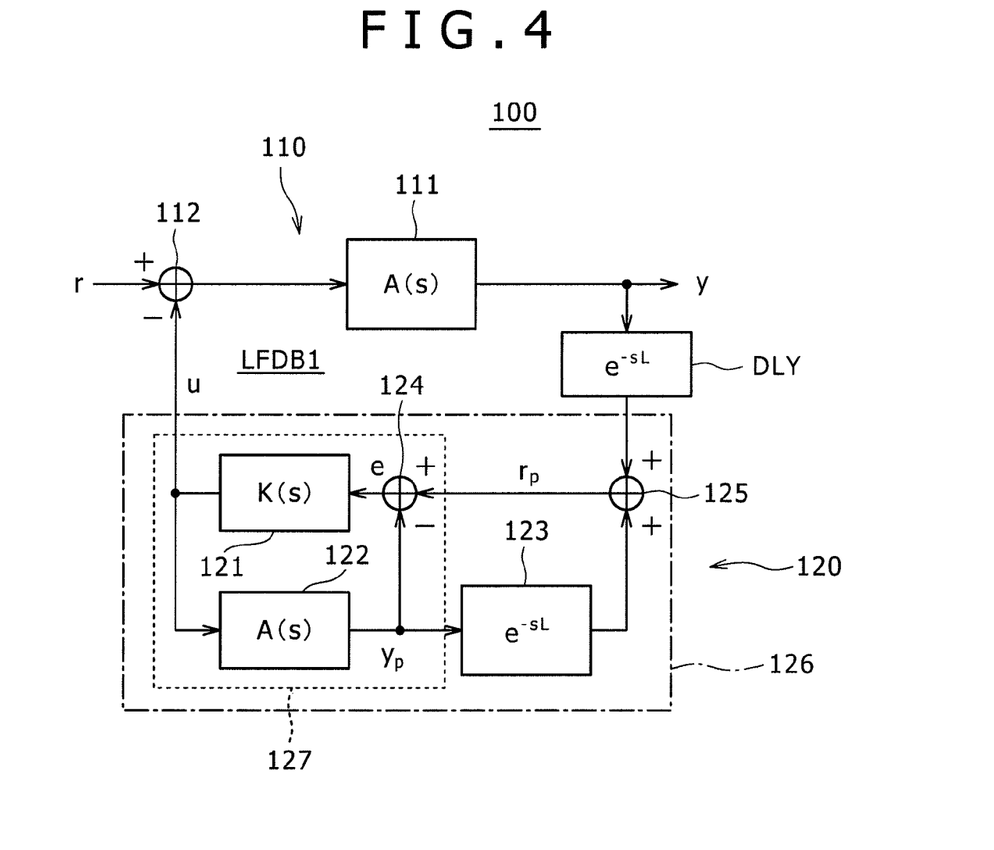
FIG. 4 is a diagram showing a configuration example of a signal processing circuit according to a first embodiment of the present invention.

FIG. 4 is a diagram showing a configuration example of a signal processing circuit according to a first embodiment of the present invention.

A signal processing circuit 100 according to this first embodiment is equivalent to the basic configuration of a signal processing system for compensating the dead time.

In the signal processing circuit 100, a feedback loop LFDB1 is formed by a main path 110 and a negative feedback path 120.

The signal processing circuit 100 has a main path block 111 in the main path 110 of the signal and a negative feedback block 121 in the negative feedback path 120, and is formed as a negative feedback type signal processing system having a dead time in the loop.

The main path 110 is the feedback part of the negative feedback path 120, and has a subtractor 112 that performs subtraction of a reference signal (input signal) r and a control signal u on the input side of the main path block 111. DLY denotes an actual signal delay block on which the dead time existing in the loop is concentrated. It is possible to consider a model in which the delay time, which is dispersed into the main path and the blocks such as the detection system and the control system in the actual system, is concentrated on the DLY without losing the generality.

The negative feedback path 120 has, in addition to the negative feedback block 121, a replica block 122 of the main path block 111, a signal delay block 123 corresponding to the dead time, a subtractor 124, and an adder 125.

In the negative feedback path 120, an output signal e of the subtractor 124 is input to the negative feedback block 121, and the negative feedback block 121 outputs the control signal u to the replica block 122 and the subtractor 112.

The replica block 122 outputs a processing signal (pseudo actual signal) yp to the signal delay block 123 and the (−) terminal of the subtractor 124.

An output signal rp of the adder 125 is input to the (+) terminal of the subtractor 124.

An actual signal y as a processing signal that is output from the main path block 111 and includes a dead time is input to one (+) terminal of the adder 125, and a signal including the dead time of the signal delay block 123 is input to the other (+) terminal thereof.

In the negative feedback path 120, a first local negative feedback loop 126 including a dead time is formed by the negative feedback block 121, the replica block 122, the signal delay block 123, the subtractor 124, and the adder 125 as the synthesizer.

Furthermore, in the negative feedback path 120, a second local negative feedback loop 127 as an ideal system including no dead time is formed by the negative feedback block 121, the replica block 122, and the subtractor 124.

The signal processing circuit 100 having such a configuration is configured as a signal processing system by a progressive idea based on the Smith method from the negative feedback type signal processing system including a dead time shown in FIG. 2. The mechanism of the configuring thereof will be shown below.

Figure 5:
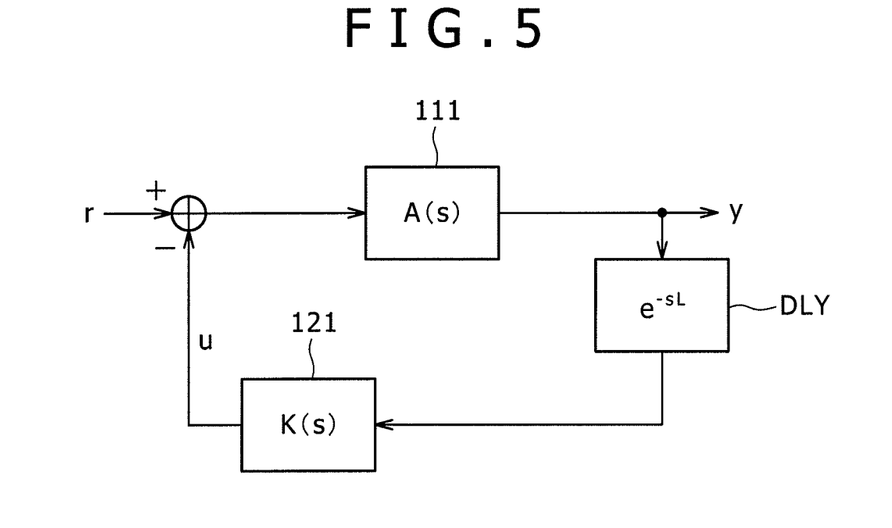
FIG. 5 is a first diagram for explaining the configuring process of the signal processing circuit of the first embodiment.

FIG. 5 is a first diagram for explaining the configuring process of the signal processing circuit of the first embodiment.

Figure 6:
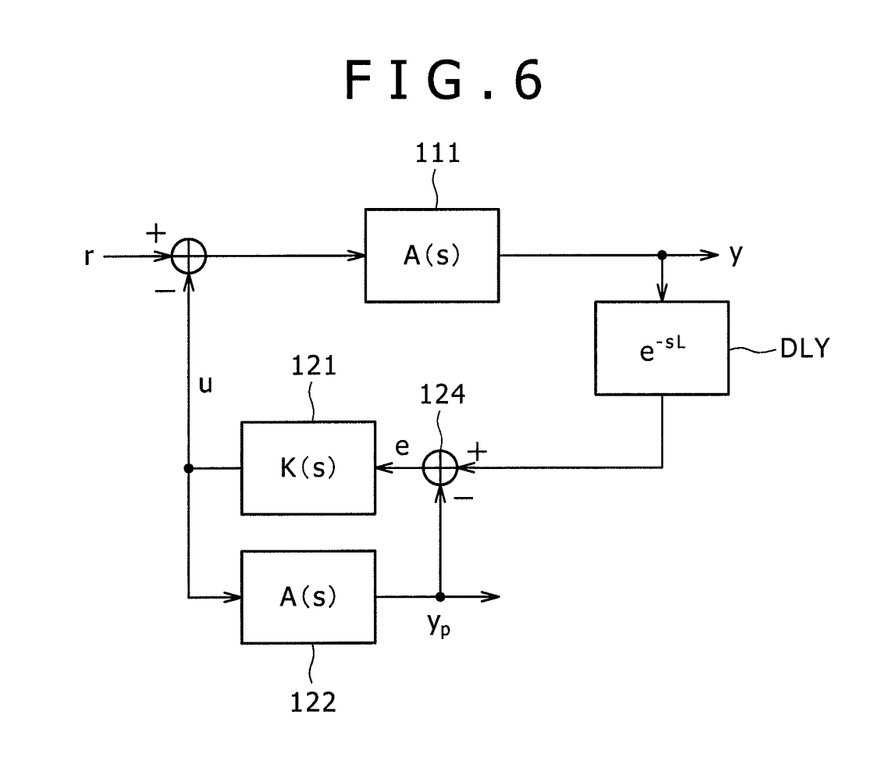
FIG. 6 is a second diagram for explaining the configuring process of the signal processing circuit of the first embodiment.

FIG. 6 is a second diagram for explaining the configuring process of the signal processing circuit of the first embodiment.

FIG. 5 and FIG. 6 are simplistically shown for easy understanding.

FIG. 5 shows a configuration in which the dead times of FIG. 2 are aggregated on the feedback side, i.e. a relationship of L=L1+L2+L3+L4 holds, and the feedback characteristics are aggregated into K(s).

Although the timing of the actual output signal y is earlier by L1, this timing difference may be ignored in considering the loop characteristics.

FIG. 6 shows a configuration in which a closed-loop system including no dead time is formed by using the replica block 122 for the negative feedback block K(s). This is not yet the completed form.

If the output signal yp of the replica block 122 is delayed by the dead time and injected into the feedback channel in consideration of the polarity, the configuration of FIG. 4 is obtained.

This configuration is the basic configuration of the signal processing system for compensating the dead time.

In the signal processing circuit 100 having the configuration of FIG. 6, the actual signal y resulting from the processing by the main path block 111 and the signal obtained by delaying the output signal yp of the replica block 122 of the main path block 111 by the signal delay block 123 are synthesized by the adder 125.

Subsequently, the synthesized signal rp is input to the local negative feedback loop 127 including no dead time.

The difference between the estimated error rp of the actual signal and the pseudo signal yp including no dead time is included in the local negative feedback loop 127 via the subtractor 124, and the control signal u including the difference is input to the subtractor 112 in the main path 110.

In this manner, the dead time factor is eliminated from the denominator of the closed-loop characteristic, and the influence of the dead time on the loop characteristics can be compensated with high responsiveness.

2. Second Embodiment

Figure 7:
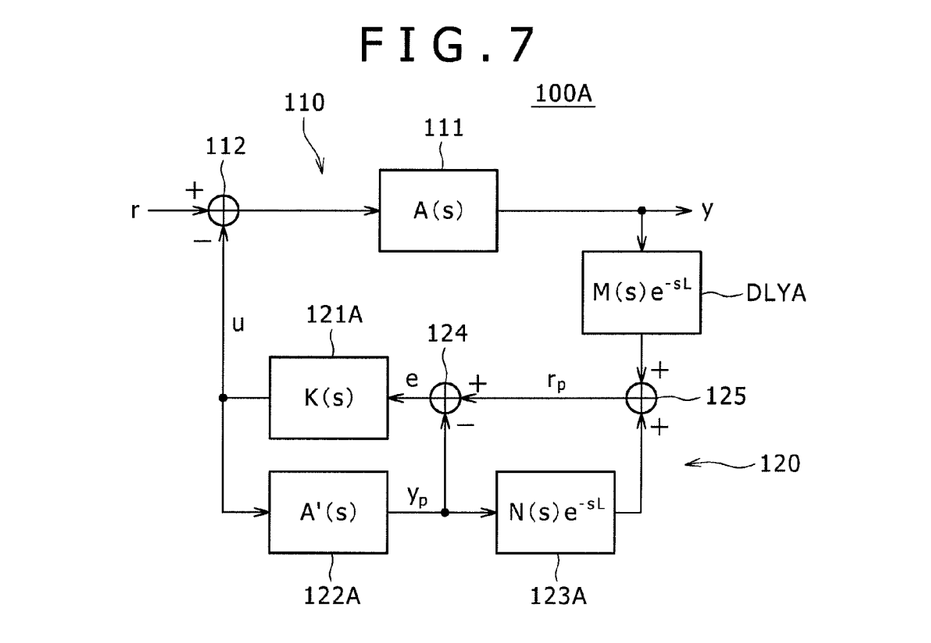
FIG. 7 is a diagram showing a configuration example of a signal processing circuit according to a second embodiment of the present invention.

FIG. 7 is a diagram showing a configuration example of a signal processing circuit according to a second embodiment of the present invention.

The basic configuration of a signal processing circuit 100A according to this second embodiment is the same as that of the signal processing circuit 100 according to the first embodiment.

In the signal processing circuit 100A according to the second embodiment, the transfer characteristic is included in the delay block in order to represent the transfer characteristic of the signal detector.

If a technique of equivalent transformation is used, dead time compensation for many signal processing systems is possible with the configuration of FIG. 4. However, in terms of application, the configuration of FIG. 7, which is a slightly-extended configuration, is more convenient as the model.

In an actual signal delay block DLYA, transfer characteristics other than that of the main path 110 of the signal, e.g. the transfer characteristics of the detection system and the driving system, are put in M(s).

Furthermore, all of the loop dead times are added into the dead time L thereof.

The transfer characteristics that allow a choice as design parameters are K(s) of a feedback block 121A, A'(s) of a replica block 122A, and N(s) of a signal delay block 123A.

If the transfer function of the signal processing circuit 100A of FIG. 7 is calculated, the following expression is obtained.

$$\frac{y}{r} = \frac{1 + A'(s)K(s) - A'(s)N(s)K(s)e^{-sL}}{1 + A'(s)K(s) + (A(s)M(s) - A'(s)N(s))e^{-sL}} A(s) \quad \text{(Expression 1)}$$

The condition to eliminate the dead time factor $e^{-sL}$ from the denominator of this expression is as follows.

$$A(s)M(s) = A'(s)N(s) \quad \text{(Expression 2)}$$

This will be referred to as the compensation condition hereinafter.

If the compensation condition is required, the closed-loop transfer function is represented by the following expression.

$$\frac{y}{r} = \left(1 - \frac{A(s)M(s)K(s)}{1 + A'(s)K(s)} e^{-sL}\right) A(s) \quad \text{(Expression 3)}$$

From the form of the first factor in the right side of this expression, it turns out that change in the input signal (reference signal) r is instantaneously multiplied by A(s) to be transmitted to the actual signal y but the response of the control starts after the delay of the time L.

The second term in the first factor in the right side has the following factor.

$$F(s) = \frac{A(s)M(s)K(s)}{1 + A'(s)K(s)} \quad \text{(Expression 4)}$$

In order for the final residue to be 0, $F(s)e^{-sL}$ needs to converge on 1. For the step response, the following condition is necessary based on the final-value theorem of the Laplace transform.

$$\lim_{s \to 0} sF(s)e^{-sL} \frac{1}{s} = \lim_{s \to 0} \frac{A(s)M(s)K(s)}{1 + A'(s)K(s)} = 1 \quad \text{(Expression 5)}$$

This will be referred to as the residual error condition hereinafter.

If K(s) is a perfect integral 1/s, the residual error condition is represented by the following expression on condition that A(0) and M(0) exist.

$$\lim_{s \to 0} \frac{A(s)M(s)K(s)}{1 + A'(s)K(s)} = \lim_{s \to 0} \frac{A(s)M(s)}{s + A'(s)} \quad \text{(Expression 6)}$$
$$= \frac{A(0)M(0)}{A'(0)}$$
$$= 1$$

This expression can be transformed as follows.

$$A'(0) = A(0)M(0) \quad \text{(Expression 7)}$$

Thus, by combination with the compensation condition, the following relationship is obtained as a special solution.

$$A'(s) = A(0)M(0) \quad \text{(Expression 8)}$$
$$N(s) = \frac{A(s)M(s)}{A(0)M(0)}$$

In this special solution, A'(s) is a constant, and the main path characteristic A(s) is moved into N(s).

The closed-loop characteristics show response close to first-order system response under the circumstances in which K(s) determines the dominant pole. This special solution is sufficient in the range of the experience. A specific example thereof will be described later.

The residual error condition in the case of a discrete system is represented as follows by using the z-transform.

$$\lim_{z \to 1} \frac{A(z)M(z)K(z)}{1 + A'(z)K(z)} = 1 \quad \text{(Expression 9)}$$

The above-described signal processing circuit 100A according to the second embodiment has higher design flexibility compared with the first embodiment. In addition, similarly to the first embodiment, the signal processing circuit 100A eliminates the error and functions as a stable system, and can appropriately compensate the influence of the dead time on the loop characteristics with high responsiveness.

3. Third Embodiment

Figure 8:
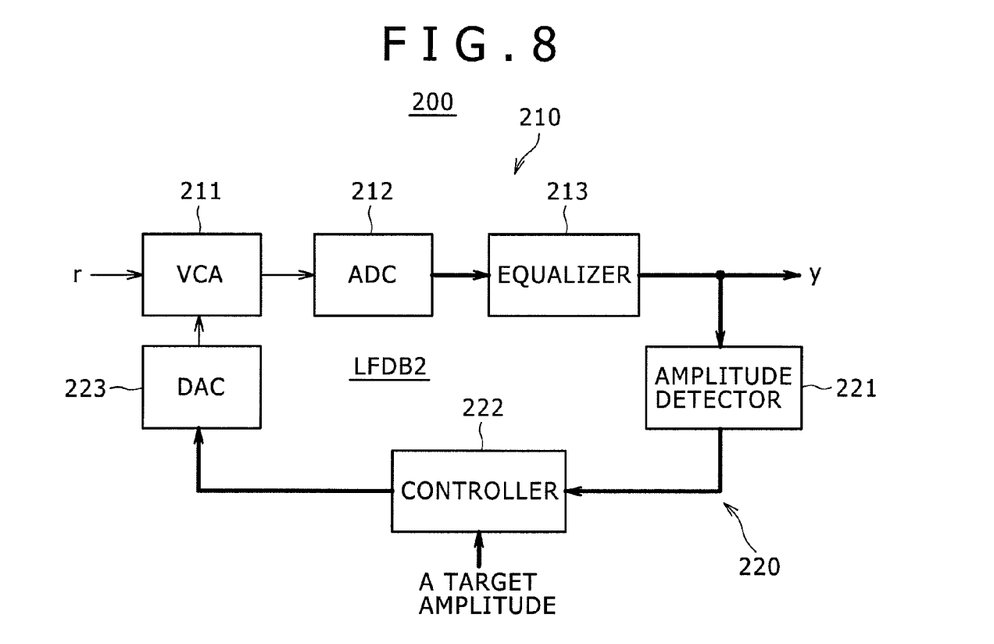
FIG. 8 is a diagram showing a configuration example of an AGC circuit according to a third embodiment of the present invention.

FIG. 8 is a diagram showing a configuration example of an AGC circuit according to a third embodiment of the present invention.

An AGC circuit 200 of this third embodiment is configured by applying thereto the signal processing circuit 100 or 100A including the dead time compensating system according to the first or second embodiment.

In this AGC circuit 200, a feedback loop LFDB2 is formed by a main path 210 and a negative feedback path 220.

In the main path 210, a voltage controlled amplifier (VCA) 211 as the variable gain unit, an analog-digital converter (ADC) 212, and an equalizer 213 as a signal processor are disposed.

In the negative feedback path 220, an amplitude detector 221, a control block (controller) 222, and a digital-analog converter (DAC) 223 are disposed.

As just described, the AGC circuit 200 is so configured as to include the ADC 212 in the feedback loop LFDB2.

In the feedback loop LFDB2, digital signal processing is executed in the channel from the output of the ADC 212 to the input of the DAC 223.

Furthermore, in the AGC circuit 200, the control block 222 is so configured as to include a first local negative feedback loop and a second local negative feedback loop in the dead time compensating system.

An input signal r is subjected to amplitude adjustment in the VCA 211 so that it matches the input range of the ADC 212. For this VCA block, an abbreviated name of VGA (variable gain amplifier) is also frequently used.

The signal digitalized by the ADC 212 passes through the equalizer 213 and is sent to a subsequent-stage signal processor.

An actual signal y is sent also to the amplitude detector 221, so that amplitude information is detected.

The control block 222 generates a proper control signal u from this amplitude information and target amplitude a, and the VCA 211 is controlled via the DAC 223.

The block pair of the DAC and the VCA does not necessarily need to be coupled to each other via an analog path, but a digital controlled amplifier (DCA) may be directly configured by combining both functions.

As the amplitude criterion, the peak-bottom (pb) amplitude, the root mean square (RMS) amplitude, the average absolute value, etc. will be available.

Because the response speed of the amplitude detection determines the response speed limit of the AGC, the design thereof is important.

In this embodiment, any circuit can be used, but a detector capable of high-speed response is desired.

Because the dead time compensating system is premised on a linear system, countermeasures against the nonlinearity of the AGC are necessary.

Figure 9:
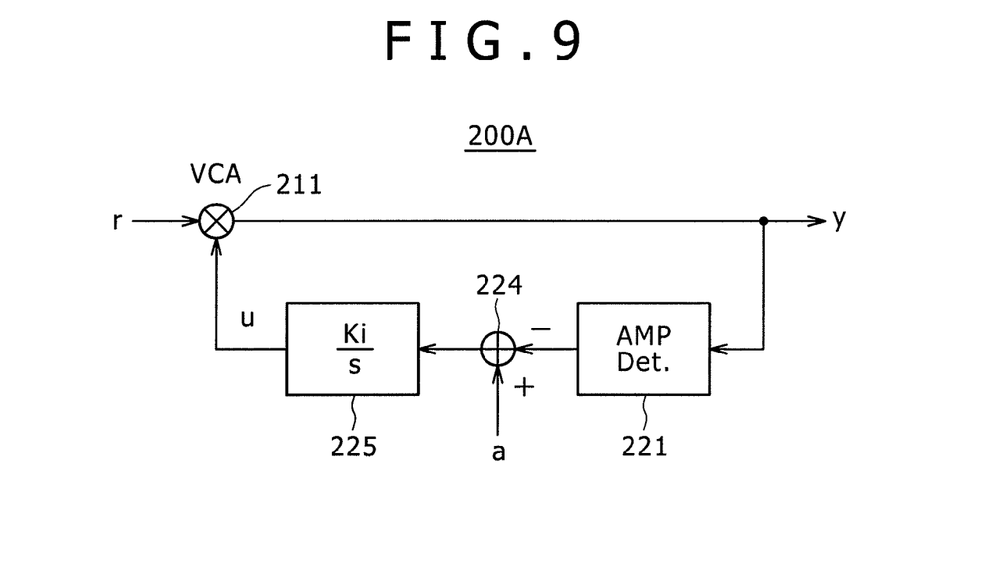
FIG. 9 is a diagram showing a simple model for explaining the nonlinearity of AGC.

FIG. 9 is a diagram showing a simple model for explaining the nonlinearity of the AGC.

An AGC circuit model 200A of FIG. 9 is so formed as to include the VCA 211, the amplitude detector 221, a subtractor 224, and an integrator 225.

In this AGC model, the difference between the amplitude of an actual output signal y of the amplitude detector 221 and the target amplitude a is obtained by the subtractor 224, and this difference is subjected to perfect integrator by the integrator 225 to become a control signal u.

The VCA 211 serves as a multiplier of an input signal r and the control signal u. The nonlinearity occurs due to this multiplier.

A wide pull-in range (in many cases, ±6 dB or wider) is required for the AGC. Therefore, linearity can not be a good approximation.

For example, a large difference in the settling time is observed between settling from a large input and settling from a small input.

Figure 10:
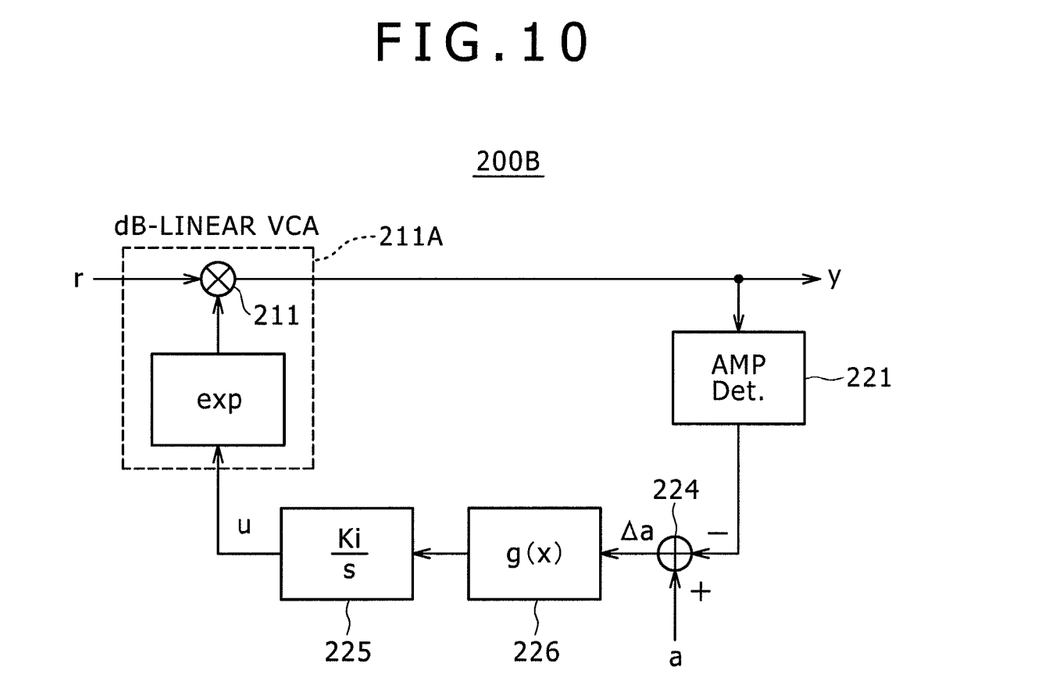
FIG. 10 is a diagram showing one example of the linearization technique for the AGC circuit.

FIG. 10 is a diagram showing one example of the linearization technique for the AGC circuit.

In an AGC circuit 200B of FIG. 10, a piecewise-linear amplifier (g(x)) 226 and a dB-linear VCA 211A are disposed as the previous and subsequent stages of the integrator 225 for quasi-linearization of the AGC loop.

The piecewise-linear amplifier (or piecewise-linear function generator) 226 outputs the value of a piecewise-linear function f(x) including an error Δa by the subtractor 224 as the variable x (x=Δa) or including the value obtained by normalizing the error Δa by the target amplitude a as the variable x (x=Δa/a).

A discussion will be made below about the piecewise-linear function applied to the piecewise-linear amplifier (or piecewise-linear function generator) 226.

[Description of Piecewise-Linear Function]

The principle of the piecewise-linear function will be described below.

Figure 11:
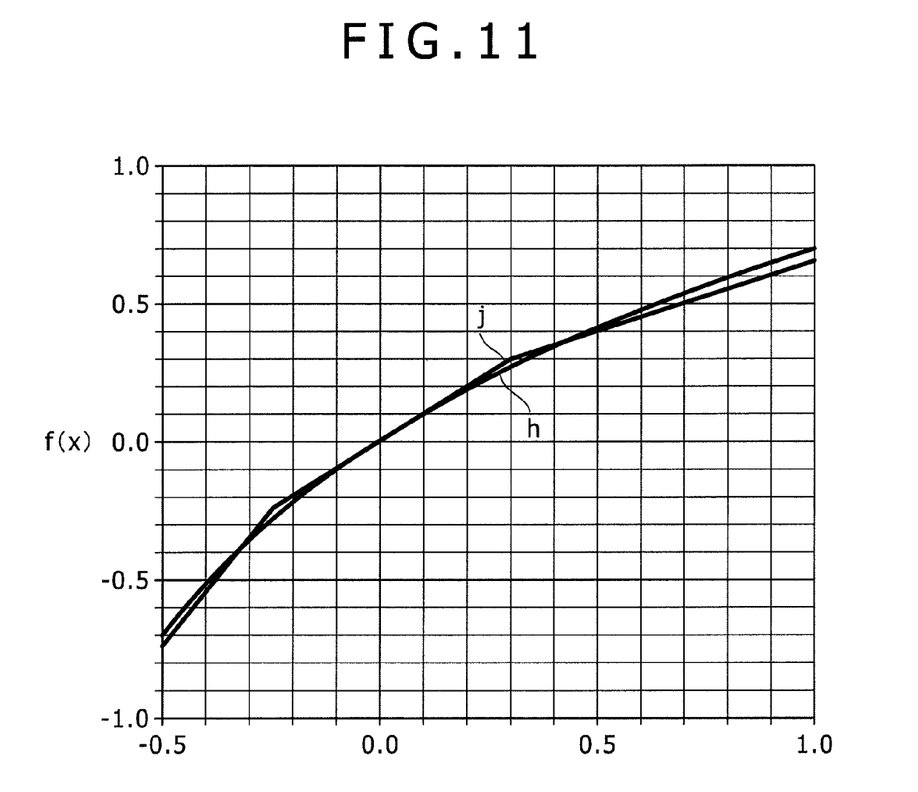
FIG. 11 is a diagram showing a graph of the principle characteristics of a piecewise-linear function obtained by combining straight lines corresponding to predetermined input ranges.

FIG. 11 is a diagram showing a graph of the principle characteristics of a piecewise-linear function obtained by combining straight lines corresponding to predetermined input ranges.

In the following description, a logarithmic function is employed as the object of the piecewise-linear function. However, the object is not limited to a logarithmic function but may be a function representing a general curve.

As described above, if the target amplitude is defined as a and the detected amplitude of the actual output signal y is defined as a+Δa, the value input to the integrator as the logarithmized amplitude error is represented by the following expression as shown in FIG. 1.

$$\log a - \log(a + \Delta a) = -\log\left(1 + \frac{\Delta a}{a}\right) \quad \text{(Expression 10)}$$

From the representation of the right side of Expression 10, it turns out that the value of this expression (i.e. the input of the integrator) depends only on the ratio of the target amplitude a and the value of Δa, which indicates the difference from this target amplitude a, and therefore the target amplitude a and Δa do not need to be considered separately from each other. Thus, substitution of Δa/a=x is employed (Δa/a is defined as the variable x).

The function log(logarithmic function) used here will be treated as the natural logarithm in the following description for simplification of description. The difference of the natural logarithm from the common logarithm is only that gain adjustment is involved. Therefore, they are the same essentially.

In Expression 10, the variable x takes a value around 0 after AGC settling. If ±6 dB, which is a typical value in signal processing, is assumed as the pull-in range of the AGC, the variable x is in the following range.

$$-5.0 \leq x \leq 1 \quad \text{(Expression 11)}$$

In this range, a function for piecewise-linear approximation is defined for the function log(1+x) represented by the above expression.

For example, a piecewise-linear function f(x) is defined as the following expression.

$$f(x) \begin{cases} 2x + 0.25 & -0.5 \leq x < -0.25 \\ x & -0.25 \leq x < 0.3 \\ 0.5x + 0.15 & 0.3 \leq x \leq 1 \end{cases} \quad \text{(Expression 12)}$$

As shown in FIG. 11, the curve represented by the function log(1+x) is indicated by symbol h, and the broken line represented by the piecewise-linear function f(x) is indicated by symbol j.

As shown in FIG. 11, in the range of the variable x from −0.5 to +1.0, the piecewise-linear function f(x) sufficiently approximates the function log(1+x).

Furthermore, the slopes of the piecewise-linear function f(x) represented by Expression 12 are 2, 1, and ½, i.e. powers of two. Therefore, particularly in digital calculation processing, the variable x of the input value can be realized by only the shift of the bit and the condition determination without using a multiplier.

That is, a device employing the piecewise-linear function based on this condition can be greatly simplified compared with a device (memory etc. and the control circuit thereof) employing a log table.

The above-described piecewise-linear function f(x) is merely one working example and various modifications are possible. Because the AGC loop forms a servo system, the AGC characteristics do not greatly change even when the line is bent at a somewhat different position on the abscissa (variable x) in the piecewise-linear function.

If the range of the AGC is further widened from ±6 dB, to e.g. ±12 dB, the following range is necessary as the value range of the variable x.

$$-0.75 \leq x \leq 3 \quad \text{(Expression 13)}$$

In this case, it is effective also as the AGC characteristics to bend the (broken) line indicating the characteristic of the piecewise-linear function f(x) into about four lines.

In the implementation based on the above-described principle, a log amplifier can be omitted, but a divider for Δa/a is required in accordance with the omission. The divider requires heavy calculation (having a large amount of calculation and taking a long time) no matter whether it is realized by an analog unit or a digital unit. Therefore, the advantageous effect of the simplification of the log function is reduced.

As a solution to this problem, configuration and method in which the piecewise-linear amplifier (piecewise-linear function generator) employs not Δa/a but Δa as its input are available.

The characteristics of such a piecewise-linear amplifier (piecewise-linear function generator) vary depending on the target amplitude a. However, on condition that large change is not observed, setting the target amplitude a to the center value in the setting range is sufficient in practical use and does not cause a problem.

Specifically, it is enough that the calculation result of the piecewise-linear function into which a+Δa, where Δa is the error (deviation) from the target amplitude a, is substituted is relatively equal to the value of the piecewise-linear function corresponding to 1+Δa/a.

In the circuit of FIG. 10, due to the action of the piecewise-linear amplifier 226, the integrator (Ki/s) 225 operates in the logarithmic region, and the linearity is kept in a wide amplitude range by the combination with the so-called dB-linear VCA (DCA, more appropriately).

Figure 12:
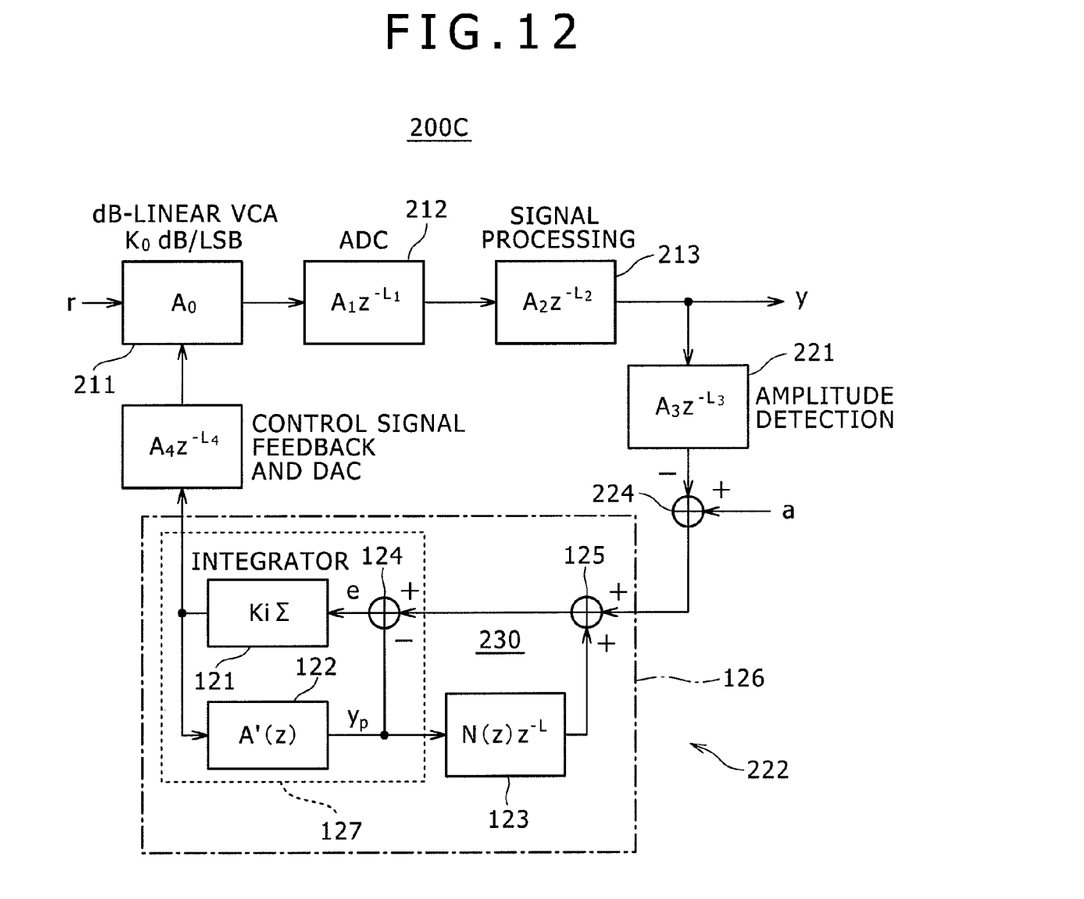
FIG. 12 is a diagram showing an example of modeling of the AGC circuit of FIG. 8 as a discrete amplitude loop.

FIG. 12 is a diagram showing an example of modeling of the AGC circuit of FIG. 8 as a discrete amplitude loop.

An AGC circuit 200C of FIG. 12 is so configured by the modeling that the control block 222 includes the subtractor 224 for the difference between the amplitude of the actual output signal y of the amplitude detector 221 and the target amplitude a and a dead time compensating system 230.

In the AGC circuit 200C, the piecewise-linear amplifier (g(x)) is regarded as an amplifier whose gain is 1 and thus is omitted. The AGC circuit 200C is diagrammatically shown in the z-transform format, reflecting digital implementation.

The dead time compensating system 230 has a configuration similar to that of the first local negative feedback loop 126 and the second local negative feedback loop 127 in FIG. 7.

In FIG. 12, the dead time compensating system 230 is represented by the same numerals as those in FIG. 7 for easy understanding.

In the negative feedback path 220, for the dead time compensating system 230, the first local negative feedback loop 126 including a dead time is formed by the negative feedback block 121, the replica block 122, the signal delay block 123, the subtractor 124, and the adder 125.

Furthermore, for the dead time compensating system 230, the second local negative feedback loop 127 as an ideal system including no dead time is formed by the negative feedback block 121, the replica block 122, and the subtractor 124.

In the case of the digital signal, the necessary bit width and decimal point position are different among the respective units. However, in gain calculation, it is enough that attention is paid only on the meaning thereof, i.e. the represented value.

In the case of seeing the loop characteristics, the loop characteristics are understood more easily when they are seen in the LSB in digital notation although the linearity is not obtained unless dB conversion is carried out.

Suppose that the gain sensitivity of the dB-linear VCA is K0 dB/LSB. In this case, when the control code changes by 1 LSB, the output amplitude is multiplied by the following value.

$$10^{\frac{K_0}{20}} \quad \text{(Expression 14)}$$

For example, when K0=0.2 dB/LSB, the output amplitude is multiplied by the following value.

$$10^{\frac{0.2}{20}} \approx 1.0233 \quad \text{(Expression 15)}$$

This means that setting the target amplitude a to 64 LSB appears as the change of 1 LSB of the control code to 64·0.0233≈1.5 LSB. That is, A0=1.5 is obtained.

The calculation here is equivalent to the unit conversion of dB and LSB. An example of the other parameters is shown in FIG. 13.

Figure 13:
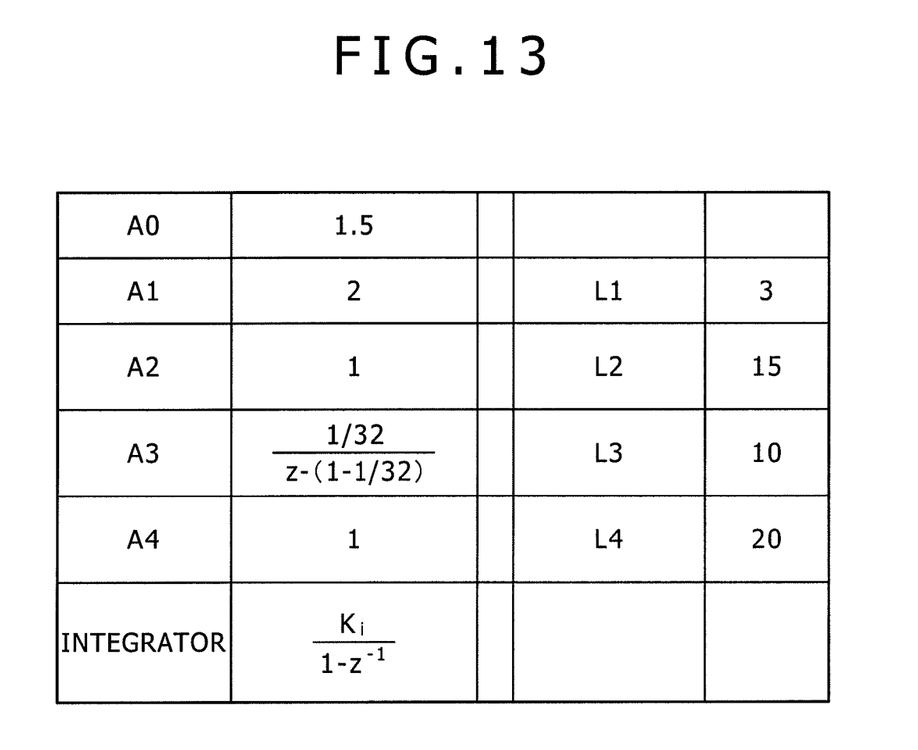
FIG. 13 is a diagram showing an example of parameters of FIG. 12.

As shown in FIG. 13, the total dead time L is L=L1+L2+L3+L4=48. The transfer function of the main path 210 is A=A0·A1·A2=3, i.e. a constant. The transfer function of A4 is also incorporated into the transfer function M(z) of the detection system to thereby make the following expression.

$$M(z) = A3 \cdot A4 = \frac{1/32}{z - (1 - 1/32)} \quad \text{(Expression 16)}$$

However, because A4=1, M(z) is identical to A3 apparently. From the residual condition of a discrete system, the following expression holds.

$$\lim_{z \to 1} \frac{A(z)M(z)K(z)}{1 + A'(z)K(z)} = \lim_{z \to 1} \frac{A(z)M(z)}{A'(z)} \quad \text{(Expresssion 17)}$$
$$= \lim_{z \to 1} \frac{3M(1)}{A'(1)}$$
$$= \frac{3}{A'(1)}$$
$$= 1$$

That is, the following relationship is obtained.

$$A'(1)=3 \quad \text{(Expression 18)}$$

From the above-stated comment for the perfect integration system, A' is defined as the following constant.

$$A'(z)=3 \quad \text{(Expression 19)}$$

From the compensation condition, N(z) is decided as follows.

$$N(z) = \frac{A(z)M(z)}{A'(z)} = M(z) = \frac{1/32}{z - (1 - 1/32)} \quad \text{(Expression 20)}$$

Figure 14:
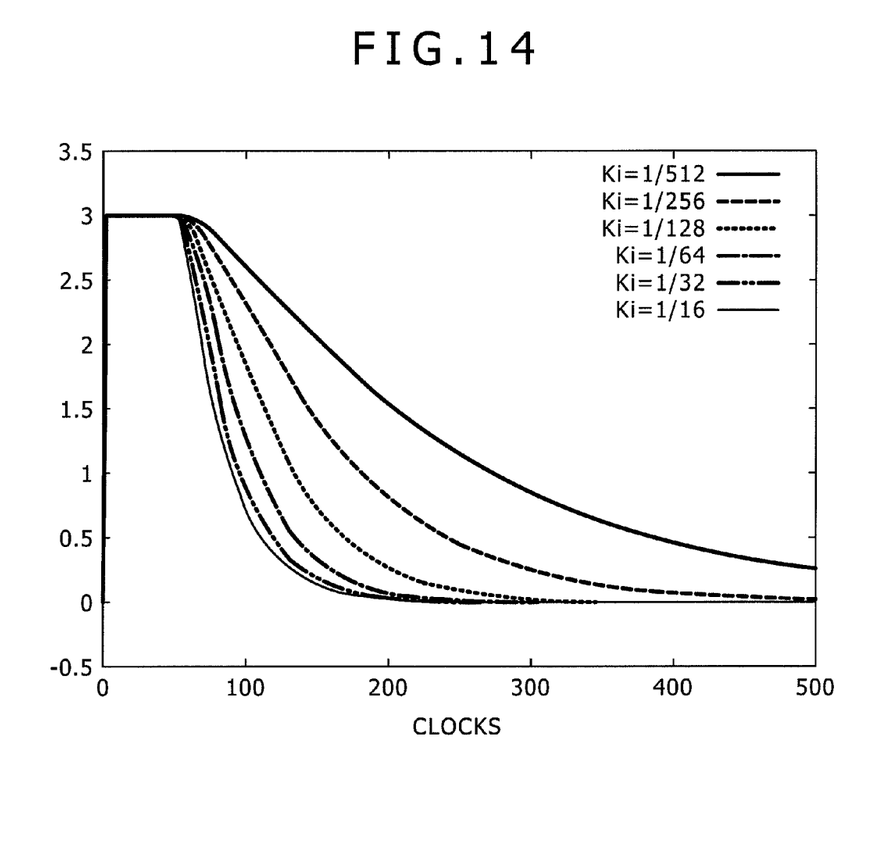
FIG. 14 is a diagram showing the response characteristic of a design example of the AGC circuit of FIG. 12.

FIG. 14 is a diagram showing the response characteristic of this design example.

FIG. 14 shows the result of a simulation by a Matlab system. In FIG. 14, the abscissa indicates the number of clocks and the ordinate indicates the amplitude error in an arbitrary scale.

From FIG. 14, it turns out that the amplitude error converges in a first-order system virtually irrespective of the setting of Ki. When Ki is small, the time constant is almost inversely proportional to Ki. When Ki is large, the speed increase is limited by the time constant of the amplitude detector.

Figure 15:
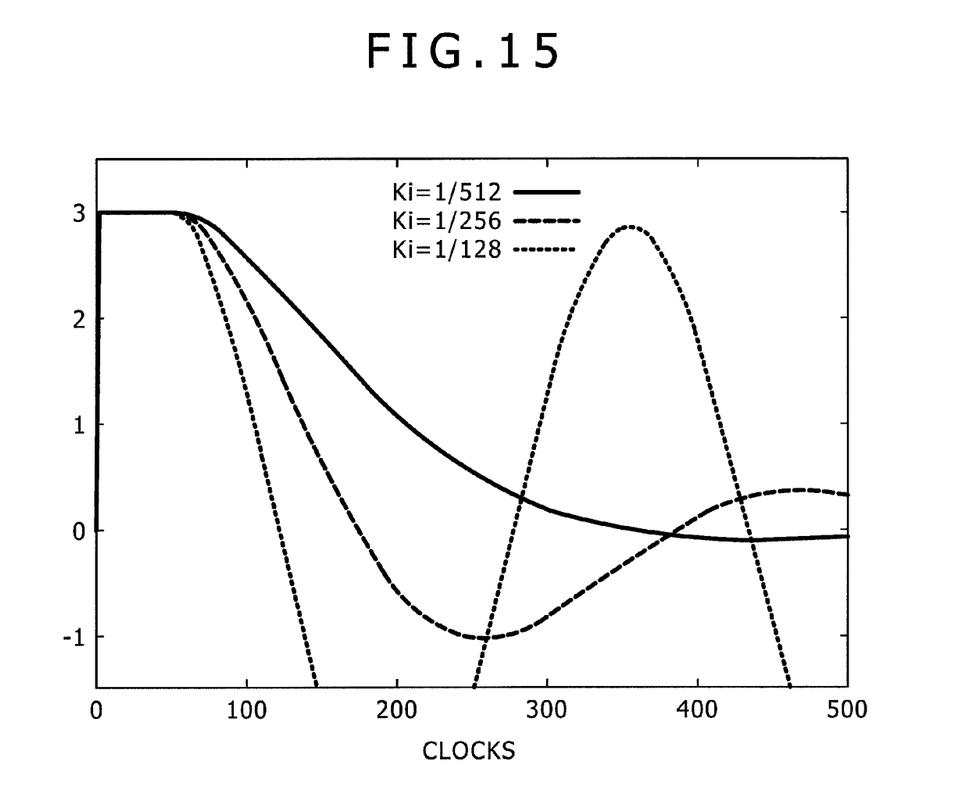
FIG. 15 is a diagram showing the response characteristic obtained when dead time compensation is excluded for comparison.

FIG. 15 is a diagram showing the response characteristic obtained when the dead time compensation is excluded for comparison.

In this case, the amplitude error shows vibratory behavior when Ki>1/512.

The response characteristic is substantially limited by the dead time and is inferior to the response characteristic of FIG. 14. As the dead time becomes longer, the difference between both also becomes larger.

Omitting N(z) at the time of the implementation is effective in hardware saving.

Figure 16:
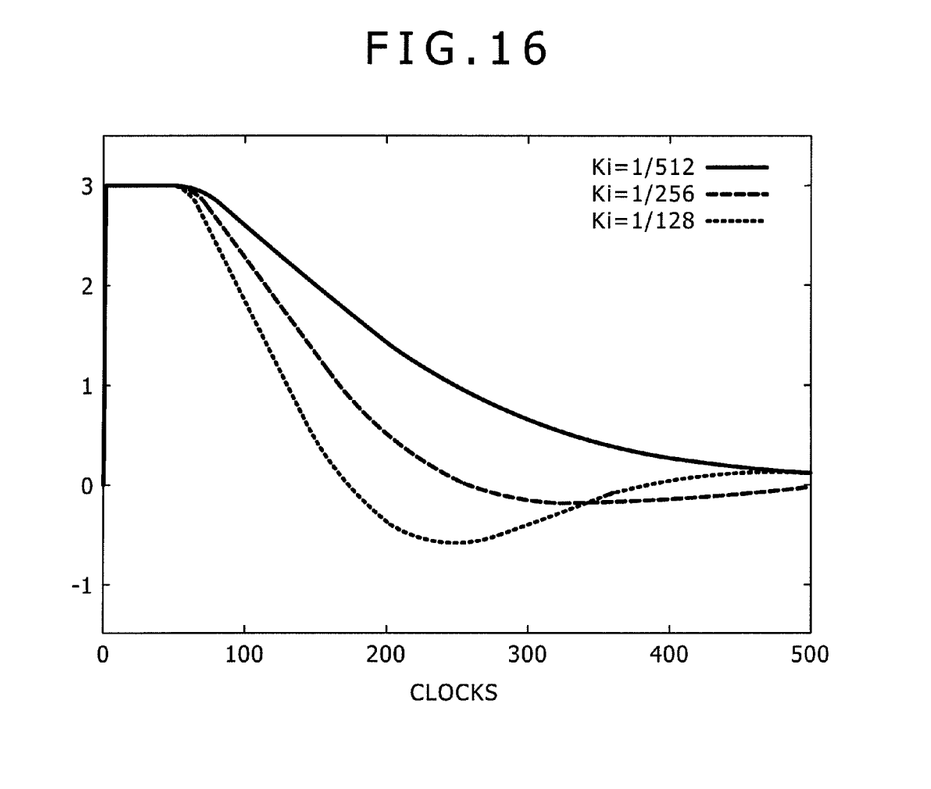
FIG. 16 is a diagram showing the response characteristic obtained when $N(z)=1$.

FIG. 16 is a diagram showing the response characteristic obtained when N(z)=1.

When Ki is large, the amplitude error shows vibratory behavior, as is to be expected. However, the response speed can be improved and undershoot is also smaller compared with the case in which the dead time compensation is not carried out. It can be said that this characteristic is sufficient unless the performance limit is pursued, because the settling is faster due to the undershoot when Ki is the same for example.

The residual condition should be satisfied as strictly as possible. As for the compensation condition, flexibility of relaxing it while seeing the response characteristic is preferable.

From a different viewpoint, such a large aberration from the theoretical conditions can be permitted. Therefore, it can be expected that variation between the replica and the actual body, which is inevitable in the actual design, also falls within the allowable range sufficiently.

As described above, according to the present embodiment, in signal processing including a dead time in the loop, the influence of this dead time on the loop characteristics can be compensated. The method of this embodiment can be used for a general purpose in such circumstances, and the additional circuit is also not large. Therefore, the application range of the method is wide.

As described in detail for the case of the AGC circuit, it is apparent that the embodiment is not limited thereto. To cite a further another example, it can be applied also to a use purpose to cancel an offset.

The AGC circuit described for the third embodiment can be applied to a recording and playback device such as an optical disk device. The configuration thereof will be described below as a fourth embodiment of the present invention.

4. Fourth Embodiment

Configuration of Recording and Playback Device

Figure 17:
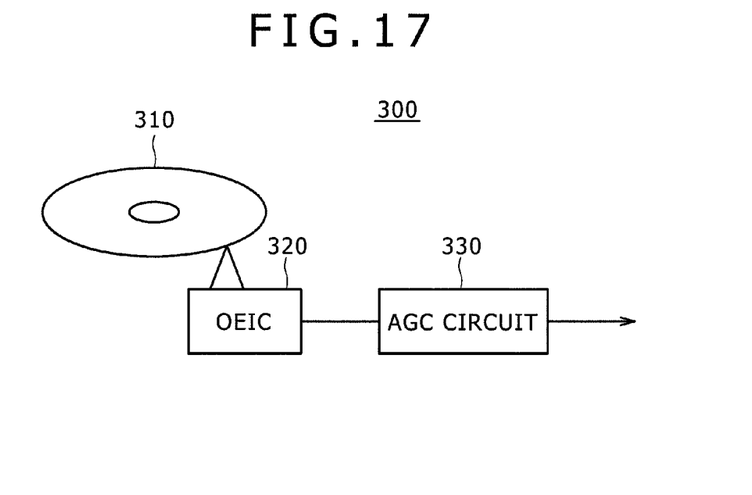
FIG. 17 is a diagram showing the block configuration of a recording and playback device to which the AGC circuit according to the embodiment of the present invention is applied.

FIG. 17 is a diagram showing the block configuration of a recording and playback device to which the AGC circuit according to the embodiment of the present invention is applied.

A recording and playback device 300 includes a spindle motor (not shown), an optical disk 310 as a recording medium, an optical-electrical conversion IC (OEIC) 320 including an optical pickup element, an AGC circuit 330, a signal processing circuit (not shown) connected to the AGC circuit 330 as the subsequent-stage circuit, and so on.

The AGC circuit 330 has the same configuration and functions as those of the AGC circuit described for the third embodiment. Therefore, the detailed description thereof is omitted here.

The OEIC 320 includes a photodiode, an amplifier (adder), and so on, and converts an optical signal to an electrical signal by the photodiode to output it to the adder. Subsequently, the OEIC 320 executes calculation processing for the input electrical signal in the adder to derive a high-frequency signal or the like.

In the signal processing circuit (not shown), the input high-frequency signal is subjected to deinterleaving and error correction and then subjected to signal processing. Thus, a video signal or an audio signal is reproduced. On the other hand, in recording operation, substantially inverse operation of the above-described operation is carried out. Specifically, video information, image information, audio information, or the like is modulated with the operation of focus control and tracking control to be written to a disk via a laser diode.

Also in this case, the AGC circuit 330 eliminates the error and functions as a stable system, and can appropriately compensate the influence of the dead time on the loop characteristics with high responsiveness.

The present application contains subject matter related to that disclosed in Japanese Priority Patent Application JP 2009-157254 filed in the Japan Patent Office on Jul. 1, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A signal processing circuit comprising:
a main path configured to transmit an input signal and output an actual signal; and
a negative feedback path configured to feed back the actual signal to an input circuit of the main path, wherein
the main path includes
a main path circuit that receives the input signal and outputs the actual signal,
the negative feedback path includes
a negative feedback circuit that generates a control signal and supplies the control signal to an input side of the main path;
a replica circuit that is supplied with the control signal of the negative feedback circuit to output a pseudo actual signal, and imitates the main path circuit; and
a signal delay circuit that delays the pseudo actual signal of the replica circuit by a dead time of a loop,
a first local negative feedback loop including a dead time is so formed as to include
the negative feedback circuit,
the replica circuit, and
the signal delay circuit,
a second local negative feedback loop including no dead time is formed by the negative feedback circuit and the replica circuit, and
the first local negative feedback loop synthesizes a synthesized signal from an output signal of the signal delay circuit and the actual signal and inputs the synthesized signal to the negative feedback circuit.

2. The signal processing circuit according to claim 1, wherein
transfer characteristics of the replica circuit and the signal delay circuit are adjusted depending on a transfer characteristic of a circuit coupled thereto.

3. The signal processing circuit according to claim 2, wherein
a relationship represented by Expression 1 is satisfied if a transfer function of the main path circuit is A(s), a transfer function of the replica circuit is A'(s), a transfer function of the signal delay circuit is N(s), and a transfer function of an actual signal delay circuit is M(s).

$$A'(s) = A(0)M(0) \qquad \text{(Expression 1)}$$
$$N(s) = \frac{A(s)M(s)}{A(0)M(0)}$$

4. The signal processing circuit according to claim 1, wherein the negative feedback path includes:
a synthesizer that synthesizes an output signal of the signal delay circuit and the actual signal and outputs a synthesized signal in the first local negative feedback loop; and
a subtractor that subtracts a pseudo actual signal of the replica circuit in the second local negative feedback loop from the synthesized signal and inputs a signal resulting from the subtraction to the negative feedback circuit.

5. An automatic gain control circuit comprising:
a main path configured to adjust amplitude of an input signal and output an actual signal; and a negative feedback path configured to feed back amplitude information of the actual signal to an amplitude adjustment stage in the main path, wherein the main path includes
a variable gain unit that varies amplitude of an input signal depending on a control signal, the negative feedback path includes
an amplitude detector that detects amplitude of an actual signal output from the main path; and
a controller that generates the control signal from amplitude information by the amplitude detector and target amplitude and outputs the control signal to the variable gain unit, the controller includes
a negative feedback circuit that generates a control signal and supplies the control signal to an input of the main path;
a replica circuit that is supplied with the control signal of the negative feedback circuit to output a pseudo amplitude signal, and imitates the main path; and
a signal delay circuit that delays a pseudo amplitude signal of the replica circuit by a dead time of a loop, a first local negative feedback loop including a dead time is so formed as to include
the negative feedback circuit,
the replica circuit, and
the signal delay circuit, a second local negative feedback loop including no dead time is formed by the negative feedback circuit and the replica block circuit, and the first local negative feedback loop synthesizes a synthesized signal from an output signal of the signal delay circuit and an amplitude signal of an actual signal and inputs the synthesized signal to the negative feedback block.

6. The automatic gain control circuit according to claim 5, wherein
transfer characteristics of the replica circuit and the signal delay circuit are adjusted depending on a transfer characteristic of a circuit coupled thereto.

7. The automatic gain control circuit according to claim 6, wherein
a relationship represented by Expression 2 is satisfied if a transfer function of the main path is A(s), a transfer function of the replica circuit is A'(s), a transfer function of the signal delay circuit is N(s), and a transfer function of an actual signal delay circuit is M(s).

$$A'(s) = A(0)M(0)$$
$$N(s) = \frac{A(s)M(s)}{A(0)M(0)}$$

(Expression 2)

8. The automatic gain control circuit according to claim 5, wherein
the controller includes:
a first subtractor that subtracts detected amplitude by the amplitude detector from the target amplitude;
a synthesizer that synthesizes an output signal of the signal delay circuit and an output signal of the first subtractor and outputs a synthesized signal in the first local negative feedback loop; and
a second subtractor that subtracts a pseudo actual signal of the replica circuit in the second local negative feedback loop from the synthesized signal and inputs a signal resulting from the subtraction to the negative feedback circuit.

9. The automatic gain control circuit according to claim 5, wherein
the variable gain unit includes
a multiplier that multiplies an input signal and the control signal, and
the controller has a function to compensate nonlinearity of the multiplier.

10. A recording and playback device comprising:
a pickup element configured to pick up information of a recording medium; and
an automatic gain control circuit configured to adjust a signal level picked up by the pickup element, wherein
the automatic gain control circuit includes
a main path that adjusts amplitude of an input signal and outputs an actual signal; and
a negative feedback path that feeds back amplitude information of the actual signal to an amplitude adjustment stage in the main path, the main path includes
a variable gain unit that varies amplitude of an input signal depending on a control signal, the negative feedback path includes
an amplitude detector that detects amplitude of an actual signal output from the main path; and
a controller that generates the control signal from amplitude information by the amplitude detector and target amplitude and outputs the control signal to the variable gain unit, the controller includes
a negative feedback circuit that generates a control signal and supplies the control signal to an input of the main path;
a replica circuit that is supplied with the control signal of the negative feedback circuit to output a pseudo amplitude signal, and imitates the main path; and
a signal delay circuit that delays a pseudo amplitude signal of the replica circuit by a dead time of a loop, a first local negative feedback loop including a dead time is so formed as to include
the negative feedback circuit,
the replica circuit, and
the signal delay circuit, a second local negative feedback loop including no dead time is formed by the negative feedback circuit and the replica circuit, and the first local negative feedback loop synthesizes a synthesized signal from an output signal of the signal delay circuit and an amplitude signal of an actual signal and inputs the synthesized signal to the negative feedback block.

* * * * *